(12) United States Patent
Benkert et al.

(10) Patent No.: US 11,592,508 B2
(45) Date of Patent: Feb. 28, 2023

(54) GENERATION OF A HOMOGENIZATION FIELD SUITABLE FOR HOMOGENIZATION OF MAGNETIC RESONANCE DATA (71) Applicant: Siemens Healthcare GmbH, Erlangen (DE)

(72) Inventors: Thomas Benkert, Neunkirchen am Brand (DE); Fasil Gadjimuradov, Erlangen (DE); Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/363,294

(22) Filed: Jun. 30, 2021

(65) Prior Publication Data

US 2021/0405141 A1 Dec. 30, 2021

(30) Foreign Application Priority Data

Jun. 30, 2020 (DE) .......................... 102020208182.4

(51) Int. Cl.
*G01V 3/00* (2006.01)
*G01R 33/56* (2006.01)
*G01R 33/54* (2006.01)
*G01R 33/565* (2006.01)

(52) U.S. Cl.
CPC ....... *G01R 33/5608* (2013.01); *G01R 33/543* (2013.01); *G01R 33/5659* (2013.01)

(58) Field of Classification Search
CPC .............. G01R 33/543; G01R 33/5659; G01R 33/3415; G01R 33/36; A61B 5/055

USPC .......................................................... 324/309
See application file for complete search history.

(56) References Cited

U.S. PATENT DOCUMENTS

| 6,400,151 B1 * | 6/2002 | Haase ................ G01R 33/5615 324/309 |
| 2013/0134972 A1 * | 5/2013 | Schulte ................ G01R 33/246 324/309 |
| 2016/0077182 A1 | 3/2016 | Wang et al. |

FOREIGN PATENT DOCUMENTS

| CN | 102956229 A | * | 3/2013 | ......... G01R 33/3854 |
| CN | 103236217 A | * | 8/2013 | |
| CN | 107561467 A | * | 1/2018 | ............. G01R 33/50 |
| CN | 107730567 A | * | 2/2018 | ........... G06T 11/005 |
| DE | 102007009203 A1 | * | 8/2008 | ......... G01R 33/3875 |

OTHER PUBLICATIONS

Tustison, N. et. al., "N4ITK: Nick's N3 ITK Implementation For MRI Bias Field Correction," https://www.insight-journal.org/browse/publication/640, The Insight Journal, 2009.

(Continued)

*Primary Examiner* — Walter L Lindsay, Jr.
*Assistant Examiner* — Frederick Wenderorth
(74) *Attorney, Agent, or Firm* — Banner & Witcoff Ltd.

(57) ABSTRACT

In a method for generation of a homogenization field suitable for homogenization of magnetic resonance data of an examination object, first magnetic resonance data from an examination region of the examination object is provided, a trained function is provided, a homogenization field is extracted by processing the first magnetic resonance data by way of the trained function, and the homogenization field is provided.

20 Claims, 6 Drawing Sheets

(56) References Cited

OTHER PUBLICATIONS

Ronneberger, O., Fischer, P., & Brox, T.: "U-net: Convolutional networks for biomedical image segmentation," Computer Science Department and BIOSS Centre for Biological Signaling Studies, University of Freiburg, pp. 234-241; 2015.

Simkó, Attila et al:; "A Generalized Network for MRI Intensity Normalization" In: Proceedings of Machine Learning Research; Linder Review: 1-4 Extended Abstract; 2019.

Wan, Fengkai et al:; "Simultaneous MR knee image segmentation and bias field correction using deep learning and partial convolution;" SPIE Medical Imaging; vol. 10949; doi: 10.1117/12.2512950; 2019.

Krebs, Julian et al.: "Unsupervised Probabilistic Deformation Modeling for Robust Diffeomorphic Registration"; arXiv:1804.07172v2; 2018; 2018.

Zhou, T. et. al., "A review: Deep learning for medical image segmentation using multi-modality fusion", Array 3-4 (2019) 100004, https://doi.org/10.1016/j array.2019.100004; 2019.

Tavakoli, A. et. al., "Improved Liver Diffusion-Weighted Imaging at 3 T Using Respiratory Triggering in Combination With Simultaneous Multislice Acceleration", Investigative Radiology, vol. 54, No. 12, 2019.

De Vos, B. et. al., "A Deep Learning Framework for Unsupervised Affine and Deformable Image Registration", Medical Image Analysis, https://arxiv.org/abs/1809.06130, 2018.

Vaidya, M. et. al., "Dependence of B+1 and B-1 Field Patterns of Surface Coils on the Electrical Properties of the Sample and the MR Operating Frequency", Concepts Magn. Reson. 46(1): 25-40, doi:10.1002/cmr.b.21319, 2016.

Wikipedia.org, "Robust Statistics", https://en.wikipedia.org/wiki/Robust_statistics, 2020.

G. Balakrishnan, A. Zhao, M. R. Sabuncu, J. Guttag, and A. V.Dalca, "An unsupervised learning model for deformable medical image registration," in Proceedings of the IEEE Conference on Computer Vision and Pattern Recognition, 2018, pp. 9252-9260.; 2018.

German Action dated Apr. 29, 2021, Application No. 10 2020 208182.4.

* cited by examiner

GENERATION OF A HOMOGENIZATION FIELD SUITABLE FOR HOMOGENIZATION OF MAGNETIC RESONANCE DATA

CROSS REFERENCE TO RELATED APPLICATIONS

This patent application claims priority to German Patent Application No. 10 2020 208 182.4, filed Jun. 30, 2020, which is incorporated herein by reference in its entirety.

BACKGROUND

Field

The disclosure relates to a method, an image processing system, a computer program product and an electronically readable data carrier for generation of a homogenization field suitable for homogenization of magnetic resonance data and to a method, a homogenization system, a computer program product and an electronically readable data carrier for homogenization of magnetic resonance data.

Related Art

In a magnetic resonance device, the body of an examination object to be examined, in particular of a patient, is conventionally exposed with the aid of a main magnet to a relatively high main magnetic field, for example of 1.5 or 3 or 7 tesla. In addition, gradient pulses are played out with the aid of a gradient coil unit. High-frequency radio frequency pulses, for example excitation pulses, are then emitted via a radio frequency antenna unit by means of suitable antenna devices and this leads to the nuclear spins of particular atoms resonantly excited by these radio frequency pulses being tilted by about a defined flip angle with respect to the magnetic field lines of the main magnetic field. On relaxation of the nuclear spins, radio frequency-signals, what are known as magnetic resonance signals (MR signals), are irradiated, which are received by means of suitable radio frequency antennas and are then processed further. Finally the desired image data, what is known as MR image data, can be reconstructed from the raw data acquired in this way. The region to be represented of the examination object is the examination region. The examination object is typically a person, in particular a patient.

For a particular measurement a particular magnetic resonance control sequence (MR control sequence), also called a pulse sequence, is therefore to be emitted, which consists of a sequence of radio frequency pulses, for example excitation pulses and refocusing pulses, and gradient pulses, which are to be emitted in a suitably coordinated manner, in different gradient axes along different spatial directions. Suitably timed read-out windows are set, which specify the periods in which the induced MR signals are detected.

A magnetic field gradient, in particular a temporary magnetic field gradient, is generated in the examination region on emission of a gradient pulse. A temporary RF field, also called a B1 field, B1$^+$ field or B1 sending field, is generated in the examination region on emission of an excitation pulse. Similarly, the radio frequency antennas suitable for reception of the MR signals irradiated by the examination object, have a spatial characteristic, which is referred to as a B1 receiving field or B1$^-$ field. The B1 field and the B1 receiving field can be influenced in different ways by the geometry of the examination object and/or owing to a design of a component of the magnetic resonance device in the examination region, and can be inhomogeneous in different ways. The same applies to the main magnetic field and/or magnetic field gradients. This can result in a tissue in image data having different signal intensities, the image data therefore being corrupted. A homogenization field, known in the technical literature as a "bias field", is a spatially resolved measure representative of gentle changes in the signal intensity owing to these effects. Changes in the signal intensity owing to these effects and possible further influences typically correspond to a local reduction in the signal intensity, so image data can be locally darker and/or can have local effacements. A homogenization field can quantify locally varying signal intensities in image data. Raw data or the reconstructed image data can be homogenized on the basis of the homogenization field. A homogenization of magnetic resonance data can comprise a correction of a local variation of a signal intensity, which local variation of a signal intensity is not based on an anatomy and/or pathology of the examination object and/or the examination region. A homogenization of magnetic resonance data can comprise a reduction of local changes in the signal intensity of the image data and/or a reduction in artifacts. The homogenization field is typically individual to each examination object and each examination region. In particular, the homogenization field typically depends on a positioning of the examination object, whereby a homogenization field is approximated in the framework of each magnetic resonance examination. According to the prior art, the B1 field is measured by means of a first adjustment measurement and the B1 receiving field is approximated with a second adjustment measurement. This is typically time-consuming and, in particular for the B1 receiving field, inaccurate.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

The disclosure is based on the object of disclosing a method for efficient generation of a particularly precise homogenization field and a method for a particularly precise homogenization.

The inventive method for generation of a homogenization field suitable for homogenization of magnetic resonance data of an examination object provides the following method steps:
provision of first magnetic resonance data from an examination region of the examination object,
provision of a trained function,
extraction of a homogenization field by processing the first magnetic resonance data by way of the trained function,
provision of the homogenization field.

The first magnetic resonance data can comprise raw data. The first magnetic resonance data can comprise raw data reconstructed to form image data. The first magnetic resonance data can comprise image data mapping the examination region in at least two contrasts. The provision of the first magnetic resonance data can comprise capturing the first magnetic resonance data, in particular an acquisition of first magnetic resonance data by means of a magnetic resonance device. The provision of the first magnetic resonance data can comprise a transfer of the first magnetic resonance data from a memory unit to an image processing system.

The examination object is typically a patient, from which image data can be created during the course of a magnetic resonance examination for a clinical diagnosis. The provision, in particular the acquisition of the first magnetic resonance data, can take place during the course of the magnetic resonance examination. The first magnetic resonance data and the homogenization field are specific to the examination object, in particular to the examination region of the examination object.

The provision of the trained function can comprise a transfer of the trained function from a memory unit to an image processing system. The provision of the trained function can comprise access of the image processing system to the trained function. The trained function was preferably trained in advance in respect of magnetic resonance data and in respect of a homogenization field pertaining to the magnetic resonance data. The trained function was preferably trained in advance for a large number of different training objects, wherein in each case magnetic resonance data and a homogenization field were produced for each training object. The trained function was preferably trained in advance for different examination regions, in other words, different subregions of the training objects. The trained function therefore can be universally used for a large number of examinations.

The trained function is typically configured to generate a homogenization field by processing the first magnetic resonance data. The trained function is typically configured to provide the homogenization field via an output. The trained function is typically applied by an extraction processor.

The method for generation of a homogenization field can additionally comprise homogenization of the first magnetic resonance data using the homogenization field. The homogenization can comprise, for example, a multiplication of the magnetic resonance data by the homogenization field and/or the inverse homogenization field.

With correspondingly preceding training, trained functions can recognize connections between images particularly well and can be superior to human visual perception. The extraction of a homogenization field from first magnetic resonance data enables a robust determination of the homogenization field. In particular, a separate determination of the B1 field and/or of the B1 receiving field can be omitted. This can speed up a magnetic resonance examination, and this, in particular, reduces movement artifacts owing to a long duration of a magnetic resonance examination.

One embodiment of the method additionally comprises provision of a B1 map of the examination region, wherein the B1 map is taken into account on extraction of the homogenization field.

A B1 map comprises spatially resolved values describing the B1 field in the examination region. Magnetic resonance data for generation of a B1 map can typically be determined quickly and exactly. The use of a B1 map specific to the examination region of the examination object combined with processing of first magnetic resonance data by way of the trained function for a determination of the homogenization field enables a particularly exact determination of the homogenization field. The magnetic resonance data for generation of a B1 map can also correspond to the first magnetic resonance data.

Magnetic resonance data for generation of a B1 map can be efficiently acquired from the examination object using the magnetic resonance device, for example by means of a FLASH MR control sequence. The magnetic resonance data acquired with a FLASH MR control sequence can have a proton density-weighted contrast, i.e. a clinically usable contrast. The magnetic resonance data used and acquired for the creation of a B1 map is preferably also image data having a clinically usable contrast. The B1 map therefore can have been efficiently generated. The B1 map can be precisely determined, in particular with an MR control sequence of short duration, for the examination region of the examination object.

This embodiment is advantageous, in particular, when the first magnetic resonance data is dependent on the B1 field. A separate determination and consideration of the B1 map is advantageous in particular with dependency of the contrast of the first magnetic resonance data and/or image data reconstructed from the first magnetic resonance data on the B1 field.

This embodiment can also comprise an acquisition of the B1 map of the examination region of the examination object. This embodiment can also comprise an acquisition of magnetic resonance data from the examination region of the examination object on the basis of a FLASH MR control sequence and a generation of a B1 map and proton density-weighted image data from the magnetic resonance data. A method of this kind is particularly time-efficient.

In addition to the B1 map, a B1 receiving map can optionally be provided and be taken into account on extraction of the homogenization field. This enables a particularly accurate determination of the homogenization field.

One embodiment of the method additionally comprises a determination of a B1 receiving map based on the B1 map and the first magnetic resonance data and/or on the B1 map and the homogenization field. This embodiment of the method can additionally comprise a correction of the homogenization field using the B1 receiving map and a provision of the corrected homogenization field. In particular, the B1 receiving map and/or the corrected homogenization field can be used for homogenization of further magnetic resonance data. The B1 receiving map can be determined on the basis of the B1 map and the first magnetic resonance data and/or on the B1 map and the homogenization field since the physical proton density within a tissue and/or for a liquid is constant. Shades and/or inhomogeneities of the magnetic resonance data with proton density weighting typically correlate linearly with the B1 receiving field, so homogenized magnetic resonance data with proton density weighting can be used as a measure of a B1 receiving map. This enables a particularly efficient and exact determination of a B1 receiving map, which cannot be directly measured.

One embodiment of the method provides that the extraction of the homogenization field additionally comprises processing of the B1 map by way of the trained function.

The B1 map and the first magnetic resonance data can be linked together and the trained function provided as a linked input parameter and/or as two separate input parameters. The trained function can, in particular, have been trained on the basis of magnetic resonance data with proton density weighting and the B1 map. This embodiment enables a particularly exact determination of the homogenization field, in particular also for first magnetic resonance data having any desired contrast.

One embodiment of the method provides that the first magnetic resonance data comprises adjustment data. Adjustment data can include raw data and/or image data. Adjustment data is typically suitable for a calibration of at least one following MR control sequence and/or following MR examination. Adjustment data is typically not used directly for making a diagnosis. Adjustment data is typically captured specifically for the examination object and/or the examination region. The adjustment data is preferably captured at the beginning of an MR examination of an examination region of an examination object. Preferably, the magnetic resonance device is actuated with an MR adjustment control sequence for acquisition of the adjustment data. The MR adjustment control sequence is preferably used for a large number of examination objects, wherein the sequence parameters used, such as amplitudes and duration of the RF pulses, for the large number of examination objects typically match to at least 80%, preferably to at least 90%, particularly preferably to at least 95%. The MR adjustment control sequence can also be identical for a large number of examination objects.

In an exemplary embodiment, the trained function is trained in advance with training data comprising a large number of adjustment data elements, acquired from a large number of training objects. Owing to the identical MR adjustment control sequence used for acquisition, the adjustment data has an identical contrast and/or identical properties. The trained function is therefore very robust in respect of the contrast and/or the properties of the MR adjustment control sequence and/or the adjustment data, whereby the homogenization field can be extracted from first magnetic resonance data comprising adjustment data. Since adjustment data typically does not have a clinical contrast and is not used for diagnosis, it can typically be acquired particularly quickly, whereby the MR examination can be carried out in a particularly time- and cost-efficient manner. The homogenization field determined in this way can be used for homogenization of the image data of all MR control sequences following during the course of the MR examination.

One embodiment of the method provides that the first magnetic resonance data comprises clinical image data. Clinical image data is typically used for the diagnosis of the examination object. If the homogenization field is determined on the basis of clinical image data, then this is particularly time-efficient since an acquisition of adjustment data for the creation of a homogenization field can be omitted.

One embodiment of the method provides that the first magnetic resonance data comprises clinical image data and has a predetermined contrast. A predetermined contrast can be determined, for example, by a standardized MR control sequence to be used for acquisition of the first magnetic resonance data. This standardized MR control sequence is typically selected in such a way that the contrast generated by it is relevant for a large number of clinical diagnoses. The standardized MR control sequence can be configured, for example, to generate clinical image data with a proton density-weighted and/or T1-weighted and/or T2-weighted contrast. In particular, the standardized MR control sequence can also have further defined parameters, for example in respect of examination region and/or spatial resolution. The standardized MR control sequence can also be specific to an examination region. The standardized MR control sequence is typically independent of the examination object.

In an exemplary embodiment, the trained function is specifically trained for the predetermined contrast, so this embodiment enables a particularly robust determination of the homogenization field. This enables, in particular, efficient training of the trained function. The use of clinical image data for determination of the homogenization field is particularly time-efficient since a separate adjustment measurement can be omitted. This embodiment therefore enables a time-efficient and robust determination of the homogenization field.

In an exemplary embodiment, the homogenization field is created on the basis of the magnetic resonance data, which is acquired at the beginning of an MR examination in order to be able to homogenize subsequent further magnetic resonance data, to be acquired in the further course of the MR examination, directly using the homogenization field.

One embodiment of the method provides that the predetermined contrast comprises a suppression of a signal from water. A contrast with suppressed water signal typically visualizes fatty tissue particularly clearly and/or brightly, in other words, with a high signal intensity, in clinical image data. Local and/or spatial inhomogeneities can then be identified particularly clearly in particular in the fatty tissue and also for the trained function. This enables a robust and, at the same time, efficient determination of the homogenization field.

One embodiment of the method provides that the provision of the first magnetic resonance data comprises an acquisition of the first magnetic resonance data by means of a predetermined MR control sequence. The predetermined MR control sequence generates a predetermined contrast. The trained function has preferably been trained specifically for the predetermined contrast, so this embodiment enables a particularly robust determination of the homogenization field.

One embodiment of the method provides that the first magnetic resonance data comprises first metadata. The first metadata can characterize the MR control sequence used for acquisition of the first magnetic resonance data and/or the examination object and/or the examination region. The trained function can be configured to extract the first metadata from the first magnetic resonance data and to select on the basis of the first metadata a trained subfunction incorporated by the trained function for generation of the homogenization field. The trained subfunction has preferably been trained in advance specifically with training data at least partially including the first metadata. This embodiment makes it possible, in particular with unknown contrast and/or unknown MR control sequence used for acquisition of the first magnetic resonance data and/or unknown examination region, for a trained subfunction that is appropriate for the first magnetic resonance data to be identified and used. This increases the robustness of the method.

One embodiment of the method provides that the provision of the first magnetic resonance data comprises provision of information about the MR control sequence used for acquisition of the first magnetic resonance data.

The information about the MR control sequence used for acquisition of the first magnetic resonance data can comprise, for example, a physical parameter used for coding, such as a gradient moment. The information about the MR control sequence used for acquisition of the first magnetic resonance data can be correlated with particular artifacts in the first magnetic resonance data, in particular in the first image data. In particular, the information about the MR control sequence used for acquisition of the first magnetic resonance data can provide a conclusion about movement artifacts and/or ghosting and/or artifacts due to parallel imaging and/or blurring due to asymmetrical acquisition. Ghosting occurs, in particular, with a change in the estimated gradient delay. Artifacts due to parallel imaging occur, in particular, due to changes in the reference data, for example owing to noise.

This embodiment makes it possible for artifacts frequently occurring in particular in the case of an initially unknown MR control sequence used for acquisition of the first magnetic resonance data to be taken into account on determination of the homogenization field.

One embodiment of the method provides that the first magnetic resonance data comprises spatially resolved image points allocated in each case to a position value inside the examination region and the homogenization field is extracted by taking into account the respective position value inside the examination region. In this embodiment the first magnetic resonance data preferably comprises image data. In particular, inherent distortions can occur at the edge of the examination region. If a position value for at least one image point of the first magnetic resonance data is taken into account on extraction of the homogenization field, the homogenization field can compensate artifacts of this kind and/or they can be determined particularly accurately.

One embodiment of the method additionally comprises provision of a position of a patient supporting device, on which the examination object was positioned on an acquisition of the first magnetic resonance data, wherein the position of the patient supporting device is taken into account on extraction of the homogenization field. In particular the examination region of the examination object can be derived from the position of the patient supporting device during acquisition of the first magnetic resonance data. Thus, for example, optionally by taking into account a property of the examination object, such as the body size, it is possible to identify on the basis of the position of the patient supporting device whether the examination region comprises the abdomen or the head. This increases the accuracy of the extracted homogenization field.

One embodiment of the method additionally comprises provision of a physiological signal of the examination object, wherein the physiological signal is taken into account on extraction of the homogenization field. The physiological signal can comprise a respiratory signal and/or an ECG signal.

The provision of the physiological signal can comprise detection of the physiological signal. If the physiological signal comprises a respiratory signal, the physiological signal can be detected by means of a navigator and/or a belt and/or a respiratory sensor. Consideration of a respiratory signal enables an allocation of the first magnetic resonance data to a defined movement state. In particular, a homogenization field can be determined separately on the basis of the first magnetic resonance data and the physiological signal for each movement state.

Consideration of an ECG signal enables a differentiation of the first magnetic resonance data in respect of anticipated pulsation artifacts. The first magnetic resonance data can also be selected in such a way that only the first magnetic resonance data, which correlates with a rest state of the heartbeat, in other words, largely free of movement artifacts, is taken into account for the extraction of the homogenization field. This improves the quality of the homogenization field. This embodiment is particularly advantageous in particular in the case of diffusion-weighted first magnetic resonance data.

One embodiment of the method additionally comprises the following method steps:
provision of further magnetic resonance data of the examination region of the examination object,
homogenization of the further magnetic resonance data using the homogenization field.

In an exemplary embodiment, the provision of further magnetic resonance data can comprise capturing the further magnetic resonance data by means of at least one further MR control sequence. The further magnetic resonance data differs from the first magnetic resonance data by at least one contrast. This embodiment accordingly provides that the homogenization field determined on the basis of the first magnetic resonance data is used for the homogenization of the further magnetic resonance data. In particular, a B1 receiving map and/or a corrected homogenization field can also be used for the homogenization of the further magnetic resonance data. Since the further magnetic resonance data at least partially comprises the same examination region as the first magnetic resonance data, this can be easily and efficiently implemented. In particular if the first magnetic resonance data comprises adjustment data and/or has a predetermined contrast and/or was acquired with a predetermined MR control sequence, a very exactly determined homogenization field can be used for the homogenization of further magnetic resonance data. This also enables a precise and efficient homogenization of the further magnetic resonance data.

One embodiment of the method provides that the trained function comprises a neural network and/or a U-net and/or a convolutional neural network.

In an exemplary embodiment, the neural network has a defined number of inputs for a defined number of images and/or image data elements. The neural network preferably has an output, via which output the homogenization field is provided. The trained function and/or the neural network can also be configured to identify and/or correct artifacts in the magnetic resonance data. The U-net preferably has a sufficient depth, in particular with at least two down-sampling stages and/or two up-sampling stages, preferably at least three down-sampling stages and/or three up-sampling stages, particularly preferably at least four down-sampling stages and/or four up-sampling stages. The U-net can have at least 20 layers and/or with at least 10 input parameters. A neural network of this kind is particularly well suited to an extraction of the homogenization field since this neural network is also particularly well suited for a segmentation.

The trained function was typically trained in advance on the basis of a large number of different training objects, wherein in each case training data and a homogenization field was provided for each training object.

Training data can comprise magnetic resonance data with artifacts. Training data can comprise magnetic resonance data having different contrasts.

Training data can comprise magnetic resonance data having artifacts (artifact-affected magnetic resonance data) and this magnetic resonance data in a corrected form free from artifacts (clean magnetic resonance data).

The training data can comprise clean magnetic resonance data, which clean magnetic resonance data is overlaid with artifacts of different categories, whereby artifact-affected magnetic resonance data is generated. The training data can comprise the clean magnetic resonance data and the artifact-affected magnetic resonance data generated therefrom. The artifact-affected magnetic resonance data is preferably categorized in respect of the type of the artifact.

The training data can also comprise clean magnetic resonance data, which was identified and/or created manually and/or by taking into account metadata. The trained function was preferably trained in advance in respect of magnetic resonance data and in respect of a homogenization field associated with the magnetic resonance data. The trained function was preferably trained in advance for a large number of different training objects, wherein in each case magnetic resonance data and a homogenization field were provided for each training object. A trained function designed in this way is particularly robust and well suited to extraction of a homogenization field.

One embodiment of the method provides that the trained function was trained using numerical simulation data for homogenization fields.

In particular, the behavior of RF fields in the region of an examination object can be simulated by taking into account the components used. In particular, numerical simulations of this kind are used in the development of RF coil coils for the determination of SAR. This makes it possible to predict a B1 field and/or a B1 receiving field and/or a homogenization field as a function of an RF pulse used and therefore as a function of an MR control sequence. Consequently, using simulation programs, synthetic magnetic resonance data and a synthetic homogenization field can be created for an MR control sequence for different virtual examination objects and/or examination regions, and these can be used for training the trained function. This is a particularly efficient option for the generation of training data, and, in particular, this does not require any time-consuming magnetic resonance measurements for the generation of training data.

One embodiment of the method provides that the trained function was trained using annotated image data, wherein the annotation of the image data is based on a homogeneity of at least one segment of the image data.

A segment typically comprises a tissue, preferably a maximum of one tissue, of the examination region. This embodiment typically comprises the segmentation of at least one tissue into image data. In particular, similar tissue should be represented in image data in image data with approximately the same signal intensity. Typically, a plurality of segments surround the tissue. In homogenized image data a tissue should be homogenous within the examination region, in other words, have a homogeneous, in other words, uniform, signal intensity. The homogeneity of a tissue, in other words of a segment, can accordingly serve as a measure of homogenization field, at least within the segment. The annotation typically comprises a measure of the homogeneity of the segment. The segmentation and/or the annotation typically occurs manually. Training data of this kind is particularly suitable since, owing to the good performance of neural networks, in particular of U-nets, in respect of segmentation it can be assumed that it simulates the behavior of the neural network.

One embodiment of the method provides that the at least one segment comprises fatty tissue of the examination object. Depending on the contrast of the magnetic resonance data, fatty tissue is particularly clear and/or bright, in other words, can be identified with a high signal intensity. In particular, the fatty tissue per se is very homogeneous and free from signal variations. Local and/or special inhomogeneities can then be identified well, in particular in the fatty tissue, in an especially clear manner both visually and also for the trained function. This enables a robust and, at the same time, efficient determination of the homogenization field.

One embodiment of the method provides at least one of the following method steps:
registration of the first magnetic resonance data with each other,
generation of image data by combination of the first magnetic resonance data,
noise reduction of the first magnetic resonance data,
increasing contrast of the first magnetic resonance data,
artifact compensation of the first magnetic resonance data,
implementation of a deformation correction,
correction of misinformation in the magnetic resonance data.

The first magnetic resonance data can comprise multiple image data of the examination region, in other words, can map the examination region multiple times in the same and/or different contrast. If the first magnetic resonance data comprises at least two elements of image data mapping the same examination region, then one homogenization field respectively can be separately generated according to the inventive method for each element of image data of the at least two elements of image data. Each element of image data of the at least two elements of image data can be homogenized on the basis of the respective homogenization field. The respective homogenized image data can then be combined. The at least two elements of image data can also firstly be registered and/or combined with each other. The at least two homogenization fields can also be registered and/or combined with each other. The combined at least two elements of image data can then be homogenized and/or processed jointly using the combined homogenization field. Movement artifacts can also be compensated in this way. The trained function can also be designed for image enhancement, in particular for noise reduction and/or increasing contrast and/or increasing resolution and/or compensation of different artifacts, for example due to ghosting or incorrect fat suppression.

The inventive method for homogenization of second magnetic resonance data comprises the following method steps:
provision of the second magnetic resonance data from an examination region of the examination object,
provision of a homogenization scheme comprising the following options:
1. determination of a homogenization field based on the second magnetic resonance data using a first trained function and homogenization of the second magnetic resonance data using the homogenization field,
2. homogenization of the second magnetic resonance data using a second trained function,
3. acquisition of adjustment data of the examination region by implementation of an adjustment measurement, determination of a homogenization field based on the adjustment data and homogenization of the second magnetic resonance data using the homogenization field,
selection of an option of the homogenization scheme based on the second magnetic resonance data
homogenization of the second magnetic resonance data by implementation of the selected Option.

The selection of an option of the homogenization scheme based on the magnetic resonance data can comprise, in particular, an analysis of metadata incorporated by the magnetic resonance data. This method enables an individual option for homogenization of the magnetic resonance data which is matched the type and/or quality of the magnetic resonance data. On selection of the third option, the homogenization field can be determined, in particular, on the basis of the adjustment data according to the inventive method for generation of a homogenization field. On selection of the first option, the homogenization field can be determined, in particular, on the basis of the second magnetic resonance data according to the inventive method for generation of a homogenization field.

It is conceivable to omit a determination of a homogenization field on homogenization of magnetic resonance data. In particular, the magnetic resonance data can be homogenized according to the following method steps:
provision of magnetic resonance data from an examination region of the examination object,
provision of a trained function,
homogenization of the magnetic resonance data using the trained function.

This embodiment can also be applied if the magnetic resonance data comprises at least two elements of image data mapping the same examination region.

Each element of image data of the at least two elements of image data therefore can be separately homogenized. The respective homogenized image data can then be combined. It is also conceivable that the combination and the homogenization of the at least two elements of image data can take place in one step using the trained function.

Furthermore, the disclosure starts from an image processing system with a generator comprising an input, an output and an extraction processor. The generator is configured to carry out an inventive method for generation of a homogenization field. Via the input the generator can be provided with magnetic resonance data and/or a B1 map and/or a trained function and/or a neural network and/or an MR control sequence and/or information about an MR control sequence used for acquisition of the magnetic resonance data and/or a position of a patient supporting device and/or a physiological signal and/or an algorithm for an extraction of a homogenization field and/or an algorithm for a division of the examination region into at least two subregions and/or an algorithm for a homogenization. The generator can be provided via the input with further functions, algorithms or parameters required in the method for generation of a homogenization field. The homogenization field and/or further results of an embodiment of the inventive method for generation of a homogenization field can be provided via the output. The extraction processor is configured to process the first magnetic resonance data by way of the trained function and extraction of a homogenization field. The input, the output and/or the extraction processor can be at least partially integrated in each other and/or be at least partially connected to each other. The generator can be integrated in a magnetic resonance device and/or in an image processing system. Embodiments of the inventive image processing system are designed analogously to the embodiments of the inventive method for generation of a homogenization field. The image processing system can have further control components, which are necessary and/or advantageous for carrying out an inventive method for generation of a homogenization field. Computer programs and further software can be saved on a memory of the generator, by means of which the processor of the generator automatically controls and/or carries out a process sequence of an inventive method for generation of a homogenization field.

An inventive computer program product can be loaded directly in a memory of a programmable generator and has program code means in order to carry out an inventive method for generation of a homogenization field when the computer program product is run in the generator. As a result, the inventive method for generation of a homogenization field can be carried out quickly, in an identically repeatable manner and robustly. The computer program product is configured such that it can carry out the inventive method steps by means of the generator. The generator has to have in each case the requirements such as an appropriate main memory, an appropriate graphics card or an appropriate logic circuitry, so the respective method steps can be efficiently carried out. The computer program product is saved, for example, on an electronically readable medium or stored on a network or server from where it can be loaded into the processor of a local generator, which can be directly connected to the image processing system or can be designed as part of the image processing system. Furthermore, control information of the computer program product can be saved on an electronically readable data carrier. The control information of the electronically readable data carrier can be configured in such a way that it carries out an inventive method when the data carrier is used in a generator of an image processing system. Examples of electronically readable data carriers are a DVD, a magnetic tape or a USB stick, on which electronically readable control information, in particular software, is saved. When this control information (software) is read from the data carrier and saved in a memory and/or generator of an image processing system, all inventive embodiments of the above-described method can be carried out.

Furthermore, the disclosure starts from an electronically readable data carrier on which a program is stored, which is provided to carry out a method for generation of a homogenization field for image data.

Furthermore, the disclosure starts from a magnetic resonance device comprising an inventive image processing system and a controller. The generator and/or the image processing system can be connected to the magnetic resonance device. The generator and/or the image processing system can be integrated in the magnetic resonance device. The generator and/or the image processing system can also be installed separately from the magnetic resonance device. Embodiments of the inventive magnetic resonance device are configured analogously to the embodiments of the inventive method. The magnetic resonance device can have further control components, which are necessary and/or advantageous for carrying out an inventive method. The magnetic resonance device can also be configured to send control signals and/or to receive control signals and/or to process them in order to carry out an inventive method. The magnetic resonance device can be configured to capture first magnetic resonance data and/or further magnetic resonance data. The magnetic resonance device is typically configured to perform an MR control sequence. Preferably, the generator is part of the control unit of the inventive magnetic resonance device. Computer programs and further software can be saved on a memory unit of the generator, by means of which the processor unit of the generator automatically controls and/or carries out a process sequence of an inventive method.

The advantages of the inventive image processing system, of the inventive computer program product, of the inventive electronically readable data carrier and of the inventive magnetic resonance device substantially match the advantages of the inventive method for generation of a homogenization field for image data, which have been stated in detail above. Features, advantages or alternative embodiments mentioned in this connection can likewise also be transferred to the other claimed subject matter, and vice versa.

Furthermore, the disclosure starts from a homogenization system comprising an input, an output and a homogenization processor. The homogenization system is configured to carry out an inventive method for homogenization of magnetic resonance data. Via the input the homogenization processor can be provided with magnetic resonance data and/or a first trained function and/or a second trained function and/or a homogenization scheme and/or an algorithm for a homogenization. The homogenization processor can be provided via the input with further functions, algorithms or parameters required in the method for homogenization of magnetic resonance data. The homogenized magnetic resonance data and/or further results of an embodiment of the inventive method for homogenization of magnetic resonance data can be provided via the output. The homogenization processor is configured to homogenizate the magnetic resonance data by processing the magnetic resonance data by way of the trained function. The input, the output and/or the homogenization processor can be integrated at least partially in each other and/or can be at least partially connected to each other. The homogenization system can be integrated in a magnetic resonance device. Embodiments of the inventive homogenization system are designed analogously to the embodiments of the inventive method for homogenization of magnetic resonance data. The homogenization system can have further control components, which are necessary and/or advantageous for carrying out an inventive method for homogenization of magnetic resonance data. Computer programs and further software can be saved on a memory unit of the homogenization system, by means of which the homogenization processor of the homogenization system automatically controls and/or carries out a process sequence of an inventive method for homogenization of magnetic resonance data.

The disclosure starts from a further computer program product, which can be loaded directly in a memory unit of a programmable homogenization processor and has program code means in order to carry out an inventive method for homogenization of magnetic resonance data when the computer program product is run in the homogenization processor. Furthermore, the disclosure starts from a further electronically readable data carrier on which a program is stored, which is provided to carry out a method for homogenization of magnetic resonance data. Features of the computer program product and of the electronically readable data carrier for use for a method for generation of a homogenization field apply analogously to the further computer program product and the further electronically readable data carrier.

The advantages of the inventive homogenization system, of the inventive further computer program product and of the inventive further electronically readable data carrier substantially match the advantages of the inventive method for homogenization of magnetic resonance data, which have been stated in detail above. Features, advantages or alternative embodiments mentioned in this connection can likewise also be transferred to the other claimed subject matter, and vice versa.

Figure 1:
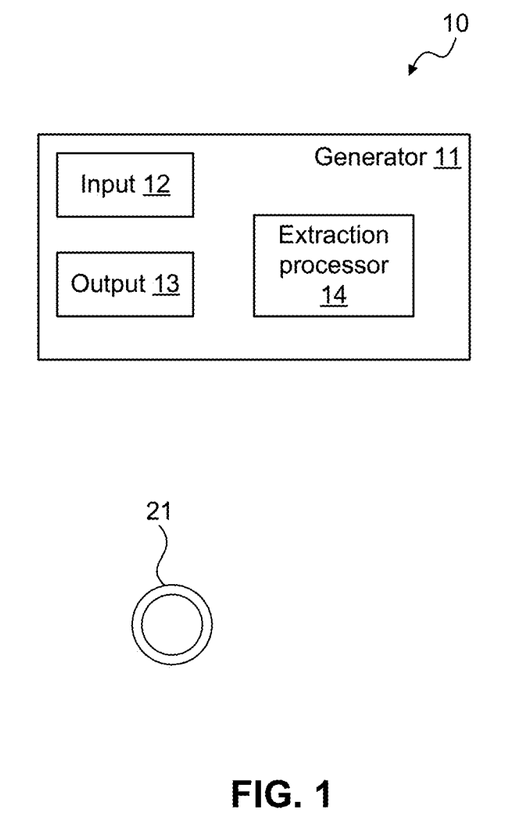
FIG. 1 shows an image processing system in a schematic representation, according to an exemplary embodiment.

FIG. 1 shows an image processing system 10 for carrying out an inventive method for generation of a homogenization field in a schematic representation. The image processing system 10 comprises a generation unit (generator) 11 having an input 12, an output 13 and an extraction processor 14.

In an exemplary embodiment, the generator 11 is configured, moreover, to carry out a method for generation of a homogenization field. For this, the generator 11 has computer programs and/or software, which can be loaded directly in a memory unit (not shown) of the generator 11, with program means in order to carry out a method for generation of a homogenization field when the computer programs and/or software are/is run in the generator 11. The generator 11 has for this a processor (not shown), which is configured to run the computer programs and/or software. Alternatively, the computer programs and/or software can also be saved on an electronically readable data carrier 21 separate from the image processing system 10 and/or generator 11, wherein data access by the generator 11 to the electronically readable data carrier 21 can occur via a data network. In an exemplary embodiment, the generator 11 includes processing circuitry that is configured to perform one or more functions of the generator 11. Additionally or alternatively, one or more components of the generator 11 may include processing circuitry that is configured to perform the respective function(s) of the component(s) therein.

A method for generation of a homogenization field can also be in the form of a computer program product, which implements the method on the generator 11 when it is run on the generator 11. Similarly, an electronically readable data carrier 21 with electronically readable control information saved thereon can be present, which comprises at least one such computer program product just described and is configured in such a way that it carries out the described method when the data carrier 21 is used in a generator 11 of an image processing system 10.

Figure 2:
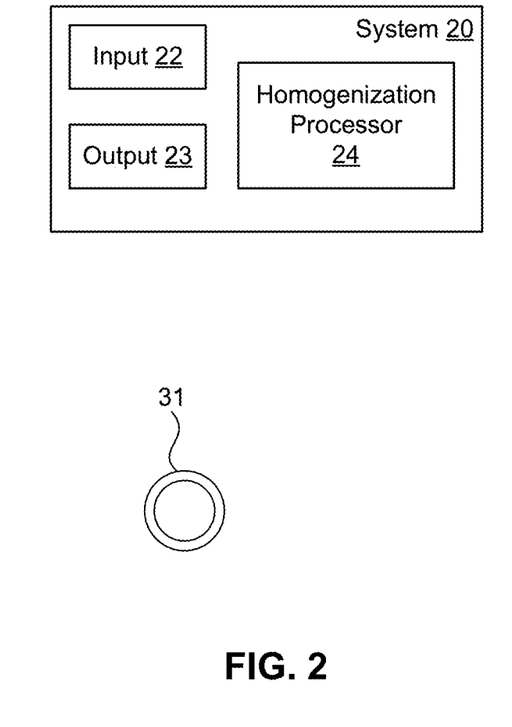
FIG. 2 shows a homogenization system in a schematic representation, according to an exemplary embodiment.

FIG. 2 shows a homogenization system 20 for carrying an inventive method for homogenization of magnetic resonance data in a schematic representation. The homogenization system 20 comprises a homogenization processor 24, an input 22 and an output 23.

The homogenization processor 24 is configured, moreover, to carry out a method for homogenization of second magnetic resonance data. For this, the homogenization processor 24 has computer programs and/or software, which can be loaded directly in a memory unit (not shown in greater detail) of the homogenization processor 24, with program means in order to carry out a method for homogenization of second magnetic resonance data when the computer programs and/or software are/is run in the homogenization processor 24. The homogenization processor 24 has for this a processor (not shown), which is configured to run the computer programs and/or software. Alternatively, the computer programs and/or software can also be saved on an electronically readable data carrier 31 designed separately from the homogenization system 20 and/or homogenization processor 24, wherein data access by the homogenization processor 24 to the electronically readable data carrier 31 can occur via a data network. In an exemplary embodiment, the homogenization system 20 includes processing circuitry that is configured to perform one or more functions of the homogenization system 20. Additionally or alternatively, one or more components of the homogenization system 20 may include processing circuitry that is configured to perform the respective function(s) of the component(s) therein.

A method for homogenization of second magnetic resonance data can also be in the form of a computer program product, which implements the method on the homogenization processor 24 when it is run on the homogenization processor 24. Similarly, an electronically readable data carrier 31 with electronically readable control information saved thereon can be present, which comprises at least one such computer program product just described and is configured in such a way that it carries out the described method when the data carrier 31 is used in a homogenization processor 24 of a homogenization system 20.

Figure 3:
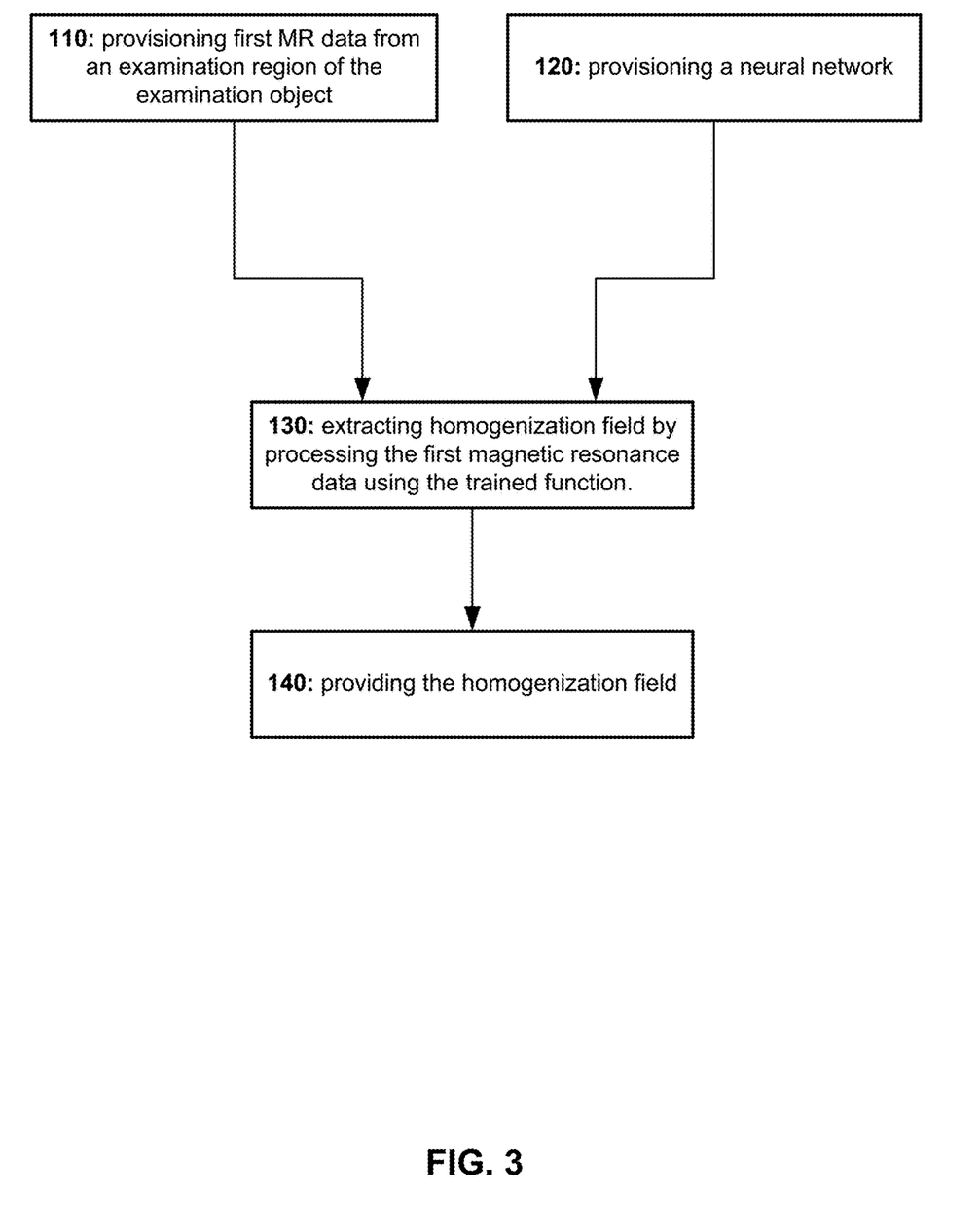
FIG. 3 shows a flowchart of a method according to an exemplary embodiment.

FIG. 3 shows a flowchart of a first embodiment of an inventive method for generation of a homogenization field. At the beginning, method step 110 takes place: the provision of first magnetic resonance data from an examination region of the examination object, and method step 120: the provision of a neural network. Method steps 110, 120 can take place at least partially at the same time. Method steps 110, 120 can take place consecutively in any desired temporal order. Method step 130 comprises an extraction of a homogenization field by processing the first magnetic resonance data by way of the trained function. The homogenization field is provided in method step 140, in other words, for example output via the output 13 and/or saved. The first magnetic resonance data provided in method step 110 can comprise adjustment data and/or clinical image data, in particular having a predetermined contrast, for example with water suppression.

Figure 4:
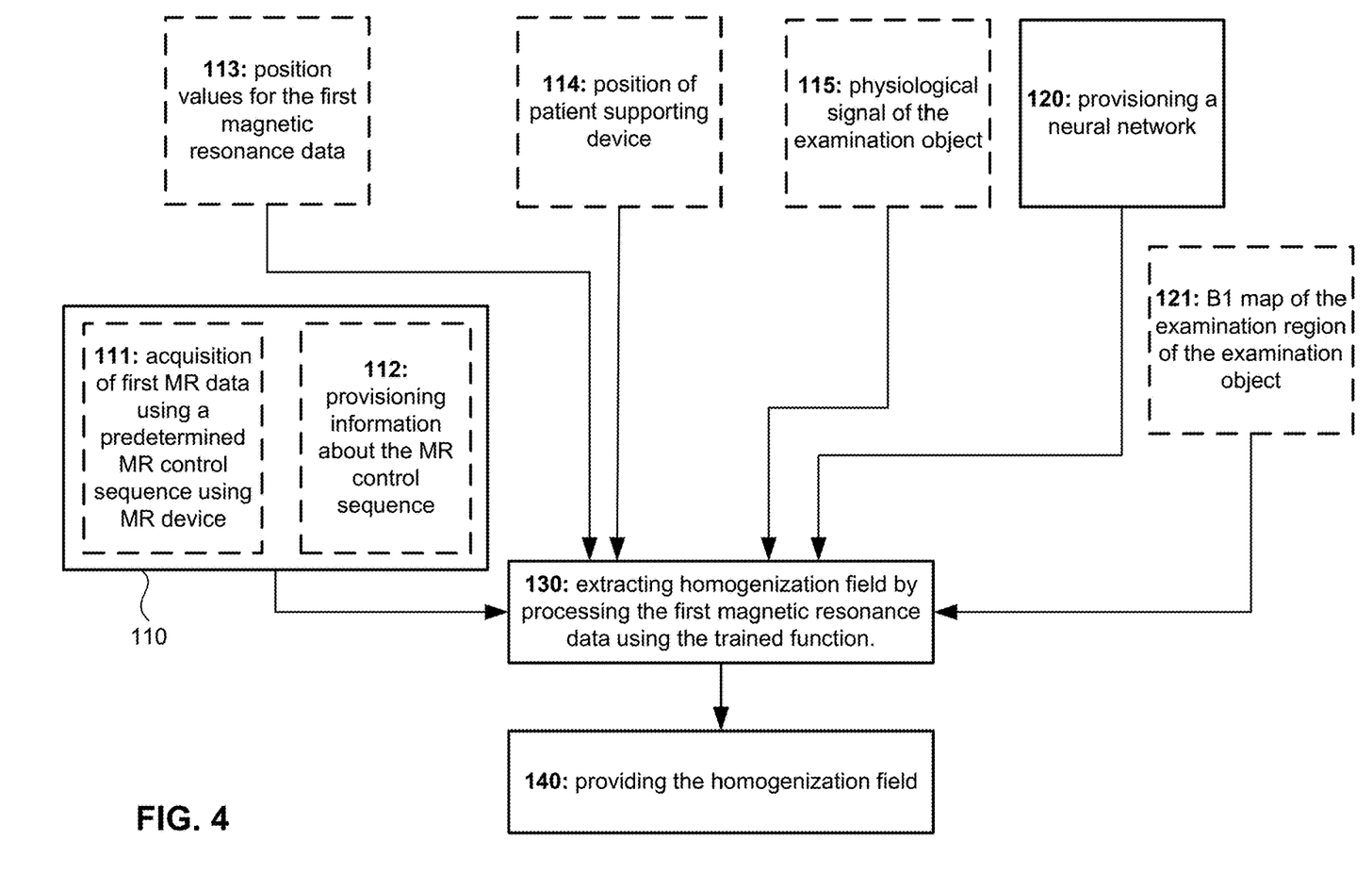
FIG. 4 shows a flowchart of a method according to an exemplary embodiment.

FIG. 4 shows a flowchart of a second embodiment of an inventive method for generation of a homogenization field. The second embodiment of the inventive method for generation of a homogenization field comprises additional, optional method steps 111, 112, 113, 114, 115, 121 compared to the first embodiment described in FIG. 3. These additional method steps 111, 112, 113, 114, 115, 121 can also be combined separately and independently of each other with the first embodiment described in FIG. 3.

Method step 110: the provision of first magnetic resonance data, can comprise method step 111: an acquisition of the first magnetic resonance data by means of a predetermined MR control sequence using a magnetic resonance device. Method step 110: the provision of first magnetic resonance data, can also comprise method step 112: a provision of information about the MR control sequence used for acquisition of the first magnetic resonance data. In method step 113, position values for the first magnetic resonance data can be provided, which are taken into account in method step 130 on extraction of the homogenization field by processing the first magnetic resonance data by way of the trained function. In method step 114, a position of a patient supporting device, on which the examination object was positioned on acquisition of the first magnetic resonance data, can be provided, which position of the patient supporting device is taken into account in method step 130 on extraction of the homogenization field. In method step 115, a physiological signal of the examination object can be provided, with the physiological signal being taken into account in method step 130 on extraction of the homogenization field. In method step 121, a B1 map of the examination region of the examination object can be provided, wherein the B1 map is taken into account in method step 130 on extraction of the homogenization field. Method step 130 can then also comprise processing of the B1 map by way of the trained function.

Figure 5:
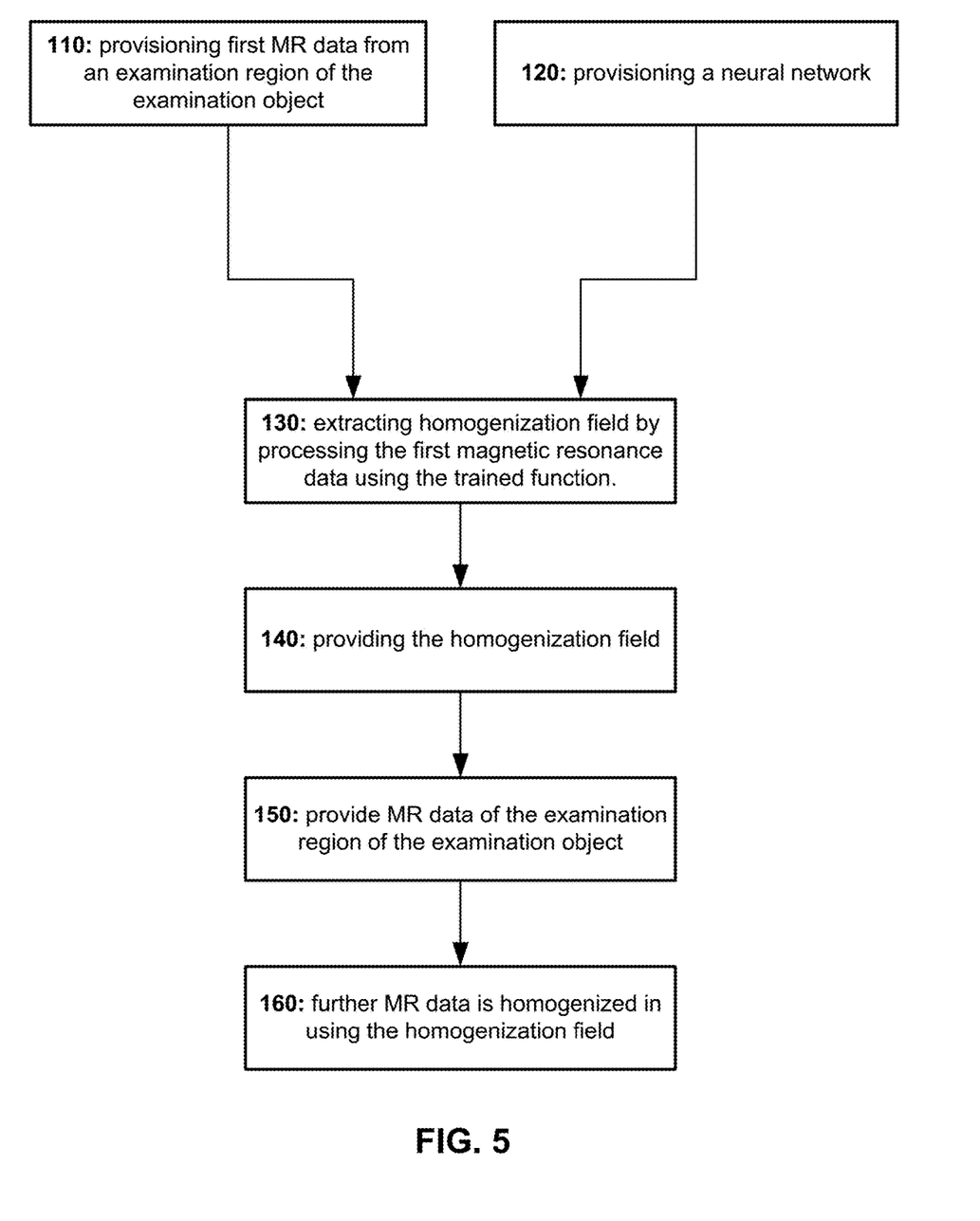
FIG. 5 shows a flowchart of a method according to an exemplary embodiment.

FIG. 5 shows a flowchart of a third embodiment of an inventive method for generation of a homogenization field. The third embodiment of the inventive method for generation of a homogenization field comprises additional method steps 150, 160 compared to the first embodiment described in FIG. 3. In method step 150, the further magnetic resonance data of the examination region of the examination object is provided. The provision of further magnetic resonance data can also comprise capturing further magnetic resonance data using a magnetic resonance device. The further magnetic resonance data is homogenized in method step 160 using the homogenization field.

Figure 6:
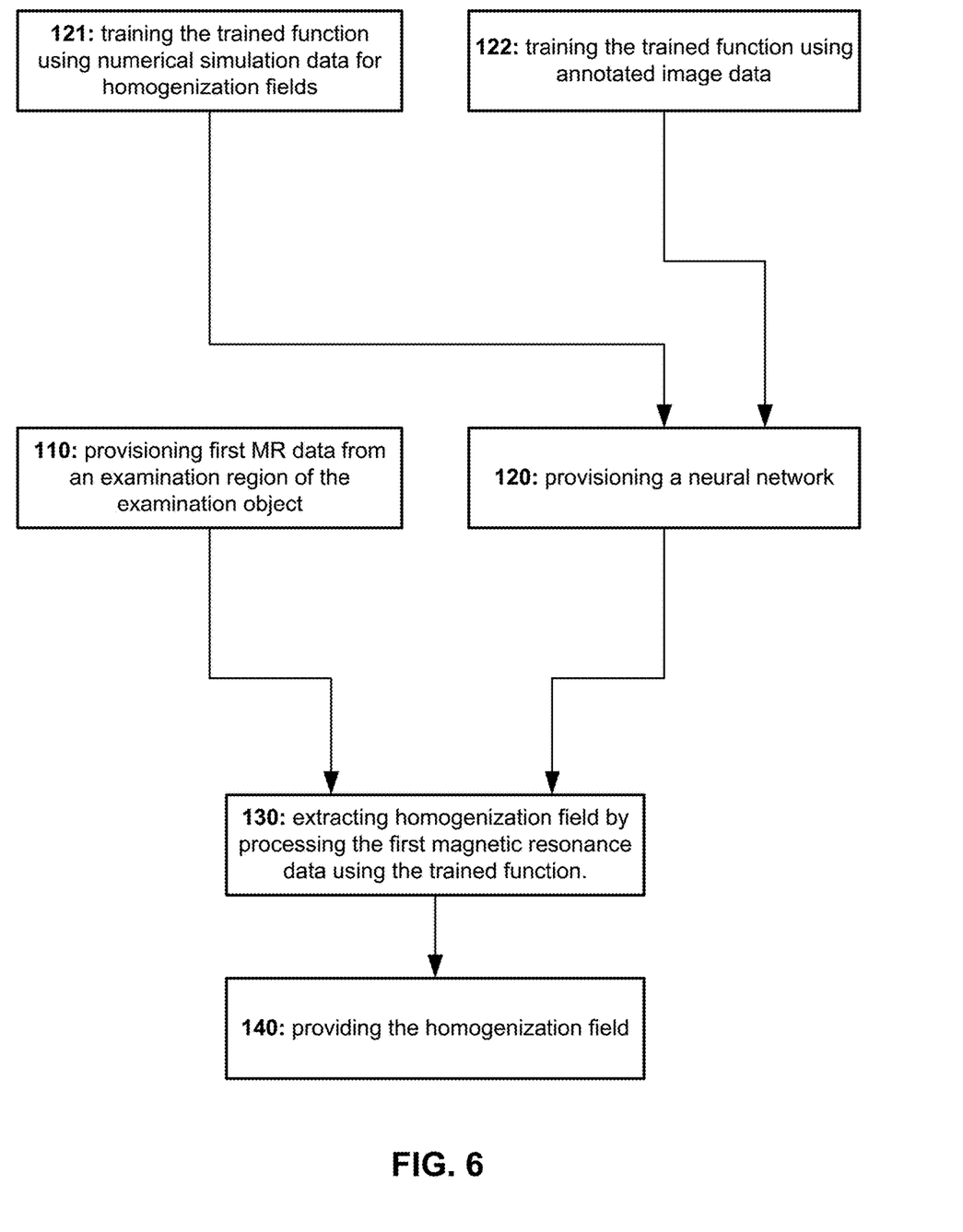
FIG. 6 shows a flowchart of a method according to an exemplary embodiment.

FIG. 6 shows a flowchart of a fourth embodiment of an inventive method for generation of a homogenization field. The fourth embodiment of the inventive method for generation of a homogenization field comprises additional method steps 121, 122 compared to the first embodiment described in FIG. 3. These additional method steps 121, 122 can also be combined separately and independently of each other with the first embodiment described in FIG. 3. Method step 121 provides a method for training the trained function using numerical simulation data for homogenization fields. Method step 122 provides a method for training the trained function using annotated image data, with the annotation of the image data being based on a homogeneity of at least one segment, in particular a segment comprising fatty tissue, of the image data. The trained function is typically designed as a neural network, in particular as a U-net and/or as a convolutional neural network.

Figure 7:
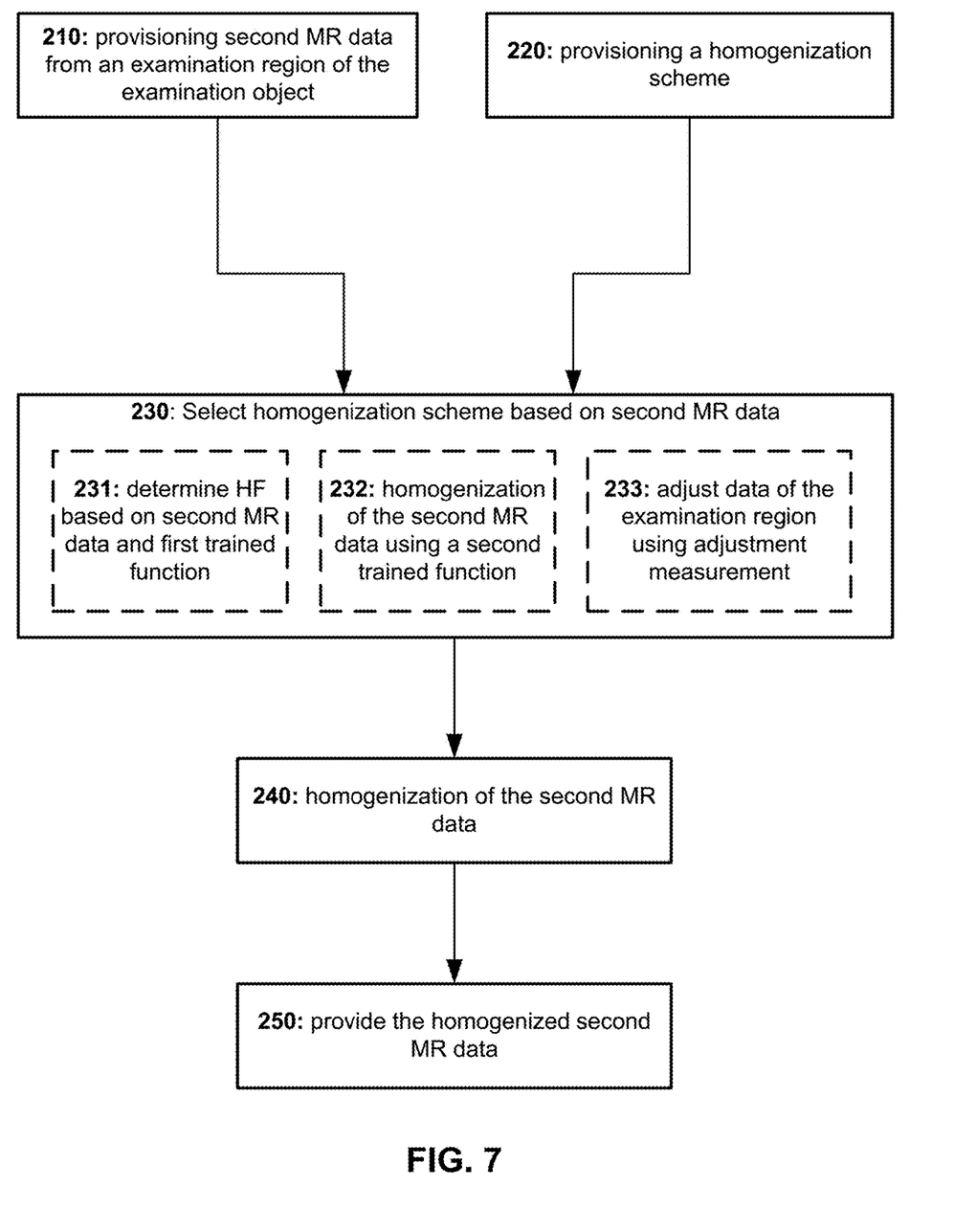
FIG. 7 shows a flowchart of a method according to an exemplary embodiment.

FIG. 7 shows a flowchart of a first embodiment of an inventive method for homogenization of second magnetic resonance data. At the beginning, method step 210 takes place: the provision of second magnetic resonance data from an examination region of the examination object, and method step 220: provision of a homogenization scheme. The method steps 210, 220 can take place at least partially at the same time. Method steps 210, 220 can take place consecutively in any desired temporal order. Method step 230 comprises a selection of an option of the homogenization scheme based on the second magnetic resonance data. Method step 240 comprises a homogenization of the second magnetic resonance data by implementation of the selected option. The homogenized second magnetic resonance data is provided in method step 250, in other words, is output for example via the output 23 and/or saved.

The options available for selection in method step 230 comprise option 231: the determination of a homogenization field based on the second magnetic resonance data using a first trained function and homogenization of the second magnetic resonance data using the homogenization field. The options available for selection in method step 230 comprise option 232: the homogenization of the second magnetic resonance data using a second trained function. The options available for selection in method step 230 comprise option 233: the acquisition of adjustment data of the examination region by carrying out an adjustment measurement, determination of a homogenization field based on the adjustment data and homogenization of the second magnetic resonance data using the homogenization field.

Although the disclosure has been illustrated and described in detail by the preferred exemplary embodiments it is not limited by the disclosed examples and a person skilled in the art can derive other variations herefrom without departing from the scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generation of a homogenization field for homogenization of magnetic resonance (MR) data from an examination object, comprising:
    acquiring, by a processor, first MR data generated by a MR imaging device, the first MR data being of an examination region of the examination object;
    accessing, by the processor, a trained function;
    determining a B1 map of the examination region of the examination object based on the first MR data, the B1 map corresponding to a B1 transmit field in the examination region;
    processing, by the processor, the first MR data using the trained function to extract a homogenization field, extraction of the homogenization field being based on the B1 map; and
    providing, by the processor, the homogenization field in electronic form as a homogenization field data file.

2. A method for a homogenization of magnetic resonance (MR) data comprising:
    acquiring, by a processor, the MR data generated by a MR imaging device, the MR data being of an examination region of the examination object;
    determining, by the processor, a homogenization scheme based on the MR data, the determination of the homogenization scheme including selecting the homogenization scheme from the group consisting of:
        (i) extracting a homogenization field from the MR data using a first trained function and based on a B1 map corresponding to a B1 transmit field in the examination region, and homogenizing the MR data using the homogenization field,
        (ii) homogenizing the MR data using a second trained function, and
        (iii) performing an adjustment measurement to acquire adjustment data of the examination region, determining the homogenization field based on the adjustment data, and homogenization of the MR data using the homogenization field; and
    performing, by the processor, the selected homogenization scheme to homogenize the MR data to generate homogenized data, the homogenized data being made available in electronic form by the processor as a data file.

3. The method as claimed in claim 1, further comprising processing the B1 map using the trained function, wherein the homogenization field is extracted based on the processed B1 map.

4. The method as claimed in claim 1, wherein the first MR data comprises adjustment data.

5. The method as claimed in claim 1, wherein the first MR data comprises clinical image data.

6. The method as claimed in claim 1, wherein the first MR data comprises clinical image data and has a predetermined contrast.

7. The method as claimed in claim 6, wherein the predetermined contrast comprises a suppression of a signal from water.

8. The method as claimed in claim 1, wherein the acquiring the first MR data comprises controlling, by the processor, the MR imaging device to perform a predetermined MR control sequence to capture the first MR data.

9. The method as claimed in claim 8, wherein the acquiring the first MR data comprises providing information about the MR control sequence used for acquisition of the first MR data.

10. The method as claimed in claim 1, wherein the first MR data comprises spatially resolved image points allocated in each case to a position value inside the examination region, the homogenization field being extracted based on the respective position value inside the examination region.

11. The method as claimed in claim 1, further comprising determining a position of a patient supporting device, on which the examination object was positioned on acquisition of the first MR data, the processing of the first MR data being further based on the position of the patient supporting device.

12. The method as claimed in claim 1, further comprising detecting a physiological signal of the examination object, the processing of the first MR data being further based on the physiological signal.

13. The method as claimed in claim 1, further comprising:
acquiring further MR data of the examination region of the examination object, and
homogenizing the further MR data using the homogenization field.

14. The method as claimed in claim 1, wherein the trained function comprises a neural network.

15. The method as claimed in claim 1, wherein the trained function has been trained using numerical simulation data for homogenization fields.

16. The method as claimed in claim 1, wherein the trained function has been trained using annotated image data, the annotation of the image data being based on a homogeneity of at least one segment of the image data.

17. The method as claimed in claim 16, wherein the at least one segment comprises fatty tissue of the examination object.

18. The method as claimed in claim 1, comprising:
registration of the first MR data with each other,
generation of image data by combination of the first MR data,
noise reduction of the first MR data,
increasing contrast of the first MR data,
artifact compensation of the first MR data,
implementation of a deformation correction, and/or
correction of misinformation in the first MR data.

19. An image processing system with a generator comprising an input, an output, and a processor, the processor being configured to perform the method of claim 1 to generate a homogenization field.

20. A non-transitory computer-readable storage medium with an executable program stored thereon, that when executed, instructs a processor to perform the method of claim 1.

* * * * *